(12) United States Patent
Powell et al.

(10) Patent No.: US 8,111,504 B2
(45) Date of Patent: Feb. 7, 2012

(54) CURRENT SENSOR ASSEMBLY

(75) Inventors: Rodney Powell, Cedar Rapids, IA (US);
Jerry Scheel, Cedar Rapids, IA (US);
Randall J. Gass, Cedar Rapids, IA (US)

(73) Assignee: Schneider Electric USA, Inc., Palatine, IL (US)

( * ) Notice: Subject to any disclaimer, the term of this patent is extended or adjusted under 35 U.S.C. 154(b) by 384 days.

(21) Appl. No.: 12/494,525

(22) Filed: Jun. 30, 2009

(65) Prior Publication Data

US 2010/0148901 A1 Jun. 17, 2010

Related U.S. Application Data

(63) Continuation-in-part of application No. 12/336,058, filed on Dec. 16, 2008.

(51) Int. Cl.
*H02B 1/20* (2006.01)

(52) U.S. Cl. .......... 361/652; 361/42; 361/648; 361/603; 361/623; 361/634

(58) Field of Classification Search .............. 361/42, 361/601, 603, 623, 634, 637, 652, 673, 648; 174/260
See application file for complete search history.

(56) References Cited

U.S. PATENT DOCUMENTS

| | | | |
|---|---|---|---|
| 4,764,744 A * | 8/1988 | Alley et al. | 336/131 |
| 4,907,342 A | 3/1990 | Castonguay et al. | |
| 6,707,256 B2 * | 3/2004 | Brunker et al. | 315/112 |
| 7,002,440 B2 | 2/2006 | Attarian et al. | |
| 7,026,894 B2 | 4/2006 | Tobin et al. | |
| 7,427,856 B2 | 9/2008 | Jones | |
| 7,477,501 B2 | 1/2009 | Nelson et al. | |
| 7,493,222 B2 | 2/2009 | Bruno | |
| 7,511,229 B2 | 3/2009 | Vlasak et al. | |
| 7,514,932 B2 | 4/2009 | Murry et al. | |
| 7,535,686 B2 | 5/2009 | Valdes et al. | |
| 7,652,871 B2 * | 1/2010 | Caggiano et al. | 361/652 |
| 2006/0274482 A1 | 12/2006 | Vlasak et al. | |
| 2008/0012677 A1 | 1/2008 | Colsch et al. | |
| 2009/0015184 A1 | 1/2009 | Knierim | |
| 2009/0045892 A1 | 2/2009 | Nelson et al. | |
| 2009/0189723 A1 * | 7/2009 | Irgens | 336/55 |
| 2009/0251851 A1 * | 10/2009 | McGill et al. | 361/623 |

* cited by examiner

Primary Examiner — Hoa C Nguyen (57) ABSTRACT

A current-sensing assembly comprising a housing and first and second current transformers contained in and fixed in position by the housing. The assembly includes at least one conducting pin corresponding to each of the first and second current transformers and inserted through the housing to expose a top end and a bottom end. The top end of the pin is electrically coupled to an end of the conducting wire of the corresponding current transformer through a window in the housing coinciding with the current transformer. The top end of a common pin is electrically coupled through the window to the opposite end of the coil conductor. The bottom end of each pin is configured to be coupled to a printed circuit board. The housing includes first and second elongated rings passing substantially through the centers of the current transformers and configured to accept first and second current lines.

19 Claims, 6 Drawing Sheets

CURRENT SENSOR ASSEMBLY

This is a continuation-in-part application of application Ser. No. 12/336,058, filed Dec. 16, 2008, which is herein incorporated by reference in its entirety.

FIELD OF THE INVENTION

This invention is directed generally to electrical circuit breakers in residential load center applications, and, more particularly, to a current sensors for electrical circuit breakers.

BACKGROUND OF THE INVENTION

Circuit breakers are generally used in residential applications to provide circuit protection for low voltage distribution systems. Electrical circuits or electrical systems are protected by the circuit breakers from electrical overcurrent conditions, such as overload conditions as well as low- and high-level short circuit or fault current conditions.

Many current circuit breakers include electronic components that are generally mounted on one or more rigid printed circuit boards (also referred to as rigid circuit boards). The rigid circuit boards have a main surface that provides structural support for the electronic components and electrical connections, such as jumper wires and solder connections. The connections are useful in transmitting electrical signals from one rigid circuit board to another rigid circuit board and/or between a rigid circuit board and other electrical components. Because the main surface of the rigid circuit boards is shared by both the electronic components and the connections, space considerations on the main surface is critical for proper design and placement of the electronic components.

One problem associated with this type of rigid circuit board is that the space available for electronic components can be drastically reduced by the space requirements of the connections. For example, the width of a residential circuit breaker can be limited (e.g., a maximum width of two inches), which imposes limitations on the size of the rigid circuit boards. Another problem associated with the connections is that they require hand assembly during electronic module assembly.

Current transformers can be used in electronic circuit breakers to sense the current flowing through a wire, such as a current line. A current transformer typically includes a coil of very thin conducting wire wrapped around a core. A current line can be routed through the center of the core of a current transformer. The current through the current line routed through the core induces a current in the coil, which can be sensed. A current transformer, which includes a coil of wire and a metal core, and must accommodate an insulated conductor routed through it, can require significant space on the rigid circuit board. Moreover, because a conductor must be routed through the center of the current transformer, and the confines of the rigid circuit board are often tight, wire routing is a concern.

SUMMARY OF THE INVENTION

In an implementation of the present invention, a current-sensing assembly includes a small-footprint housing and plurality of current transformers all contained within the housing. For example, the assembly can include three current transformers stacked in a pyramid configuration, with two current transformers housed in a bottom portion of the housing and a third current transformer stacked on top of the first two. Current lines can be routed through the bores of the current transformers. Current flowing through the current lines causes induced currents in the current transformers, which can be sensed. The compact nature of the assembly reduces space requirements for the plurality of current transformers on a printed circuit board. This is advantageous, as the areas of printed circuit boards in electronic circuit breakers is generally very limited.

The current transformers can be mounted in wells in the housing and around elongated rings. The wells and elongated rings maintain the current transformers in fixed positions. The elongated rings are dimensioned just large enough to accommodate insertion of current lines during assembly, but still maintain the current lines in substantially the centers of the bores of the current transformers. Positioning the current lines in substantially the centers of the current transformers increases the accuracy of current measurements. The wells also insulate the current transformers from each other.

The conducting wires that constitute the coils of the current transformers are accessible through windows in the housing of the current-sensing assembly. The ends of the conducting wires are wrapped around L-shaped pins. The L-shaped pins provide easier access to the pins to allow the wires to be wrapped around the pins during assembly.

In another implementation of the present invention, one of the current transformers is a ground fault current transformer. The ground fault current transformer is configured to accept first and second current lines and a neutral current line. The housing can include wire routing holes such that the first and second current lines can be routed through the first and second current transformers and the ground fault current transformers in the same direction. This aides in wire management in the tight confines of an electronic circuit breaker.

Additional aspects of the invention will be apparent to those of ordinary skill in the art in view of the detailed description of various embodiments, which is made with reference to the drawings, a brief description of which is provided below.

BRIEF DESCRIPTION OF THE DRAWINGS

The invention may best be understood by reference to the following description taken in conjunction with the accompanying drawings.

DETAILED DESCRIPTION OF THE ILLUSTRATED EMBODIMENTS

Although the invention will be described in connection with certain preferred embodiments, it will be understood that the invention is not limited to those particular embodiments. On the contrary, the invention is intended to include all alternatives, modifications and equivalent arrangements as may be included within the spirit and scope of the invention as defined by the appended claims.

Figure 1:
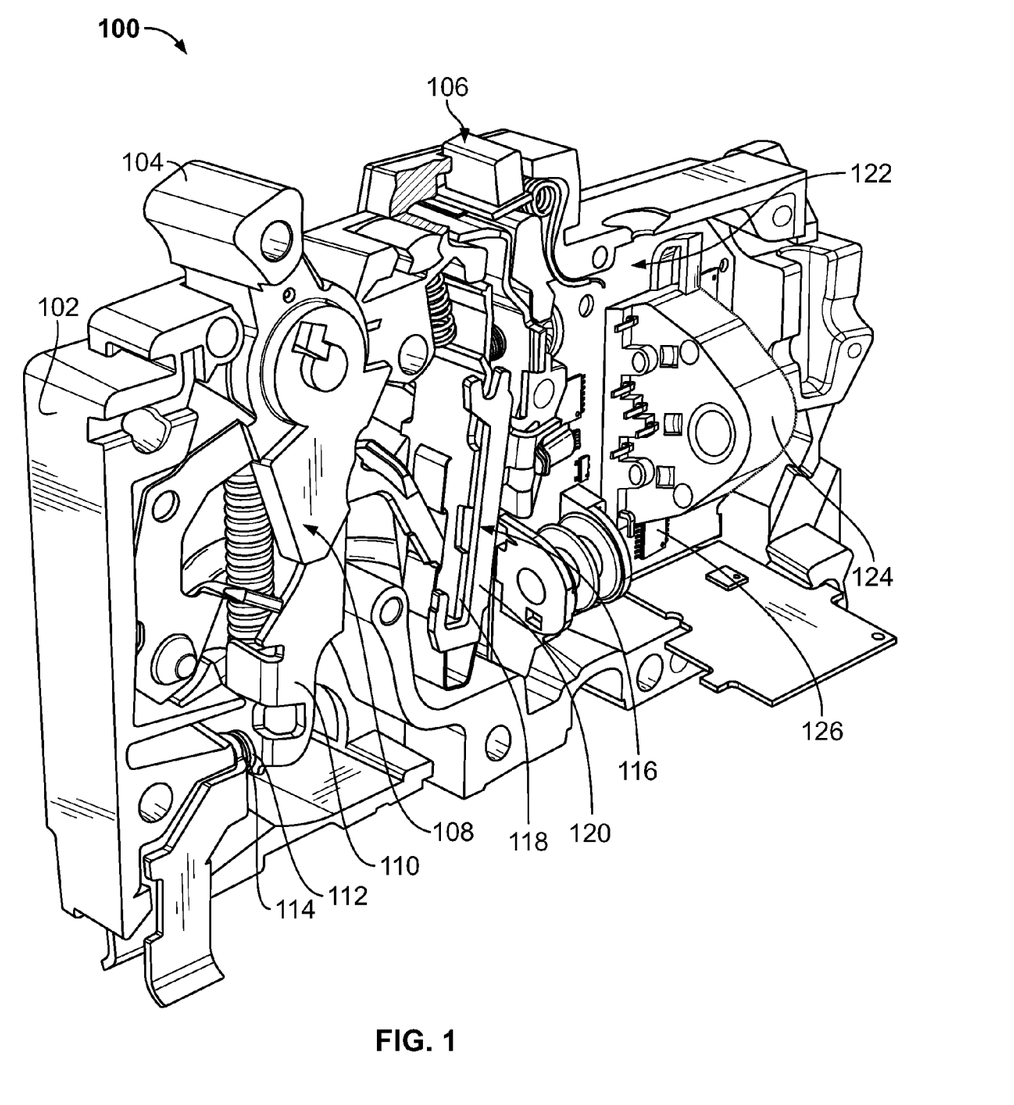
FIG. 1 is a perspective view of a circuit breaker assembly according to one embodiment.

Referring to FIG. 1, a circuit breaker 100 includes a housing 102, a handle 104, and a test button 106. The housing 102 encloses components of the circuit breaker 100 for one or more pole assemblies. For example, the circuit breaker 100 can be a multi-pole circuit breaker (e.g., a two-pole circuit breaker).

The handle 104 protrudes through the housing 102 and is generally used for resetting the circuit breaker 100. The handle 104 can also serve as a visual indication of the status of the circuit breaker 100 (e.g., tripped, on, off). The test button 106 is movable between an off position and the test position.

The enclosed components of the circuit breaker 100 includes mechanical components (on the left side) and electrical circuitry (on the right side). The mechanical components include, for example, a handle assembly 108 that is coupled to a movable blade 110 at the end of which is attached a movable contact 112. The movable contact is in direct contact with a fixed contact 114 when the circuit breaker 100 is in an "on" position of the circuit breaker 100 (i.e., when current is allowed to flow through the circuit breaker 100).

A trip mechanism 116 includes a magnetic trip armature 118 and an armature frame 120. In general, the trip mechanism 116 is the mechanism that drives a tripping action such as forcing the movable blade 110, and therefore the movable contact 112, away from the fixed contact 114. For example, the tripping action is caused by the presence of a higher current than the assigned current for the circuit breaker 100 over a specified period of time.

The electrical circuitry includes a circuit board 122 onto which numerous electrical components are mounted. For example, the circuit board 122 includes a current sensor assembly 124 and a microprocessor 126.

Figure 2:
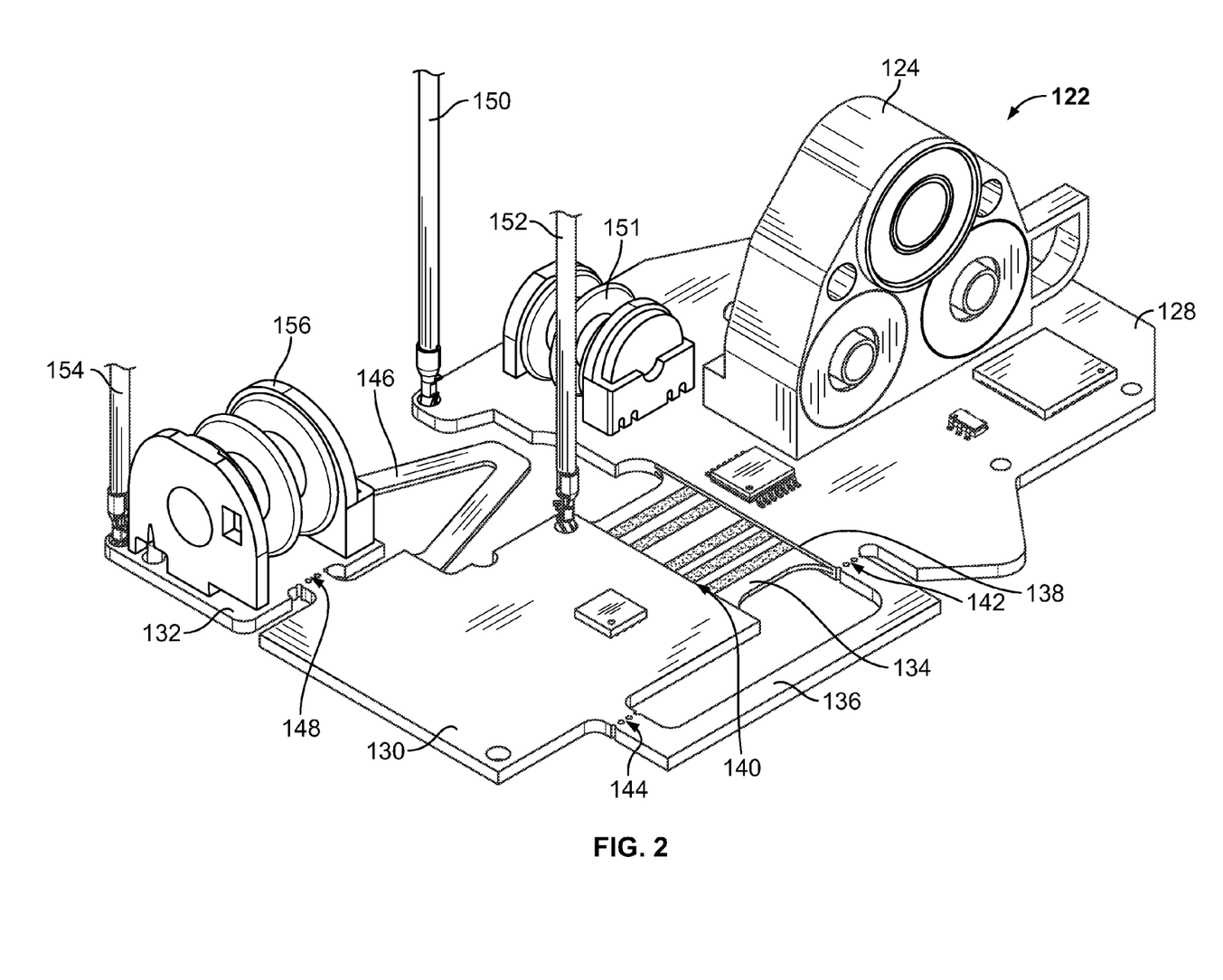
FIG. 2 is a perspective view of an assembly including a plurality of rigid circuit boards and flexible circuit boards.

Referring to FIG. 2, the circuit board 122 includes a first rigid circuit board 128, a second rigid circuit board 130, and a third rigid circuit board 132. Each of the rigid circuit boards 128-132 includes a plurality of material layers.

The first rigid circuit board 128 and the second rigid circuit board 130 are coupled to each other via a first flexible circuit board 134 and a temporary rigid member 136. The first flexible circuit board 134 extends along a first edge 138 and between layers of the first rigid circuit board 128. Similarly, the first flexible circuit board 134 extends along a second edge 140 and between layers of the second rigid circuit board 130.

The second rigid circuit board 130 and the third rigid circuit board 132 are coupled to each other via a second flexible circuit board 146 and, temporarily, via a rigid connection along a third perforation line 148. The second rigid circuit board 130 and the third rigid circuit board 132 are decoupled from each other by snapping either one of the second rigid circuit board 130 and the third rigid circuit board 132 along the third perforation line 148. After removal of the rigid connection, the second rigid circuit board 130 and the third rigid circuit board 132 are coupled to each other only via the second flexible circuit board 146.

In general, only electronic components or load lines are mounted directly on a main surface of the rigid circuit boards 128, 130, 132. Other electrical connections (e.g., jumper wires and solder connections), which have traditionally also been included on the surface of rigid circuit boards, are included in the flexible circuit boards 134, 146. For example, the first rigid circuit board 128 supports on the main surface the current sensor assembly 124, a first current line 150, a first trip solenoid 151, and other electrical components (e.g., microprocessor, memory, etc.); the second rigid circuit board 130 supports on the main surface a neutral current line 152; and the third rigid circuit board 132 supports on the main surface a second current line 154 and a trip solenoid 156.

Figure 3:
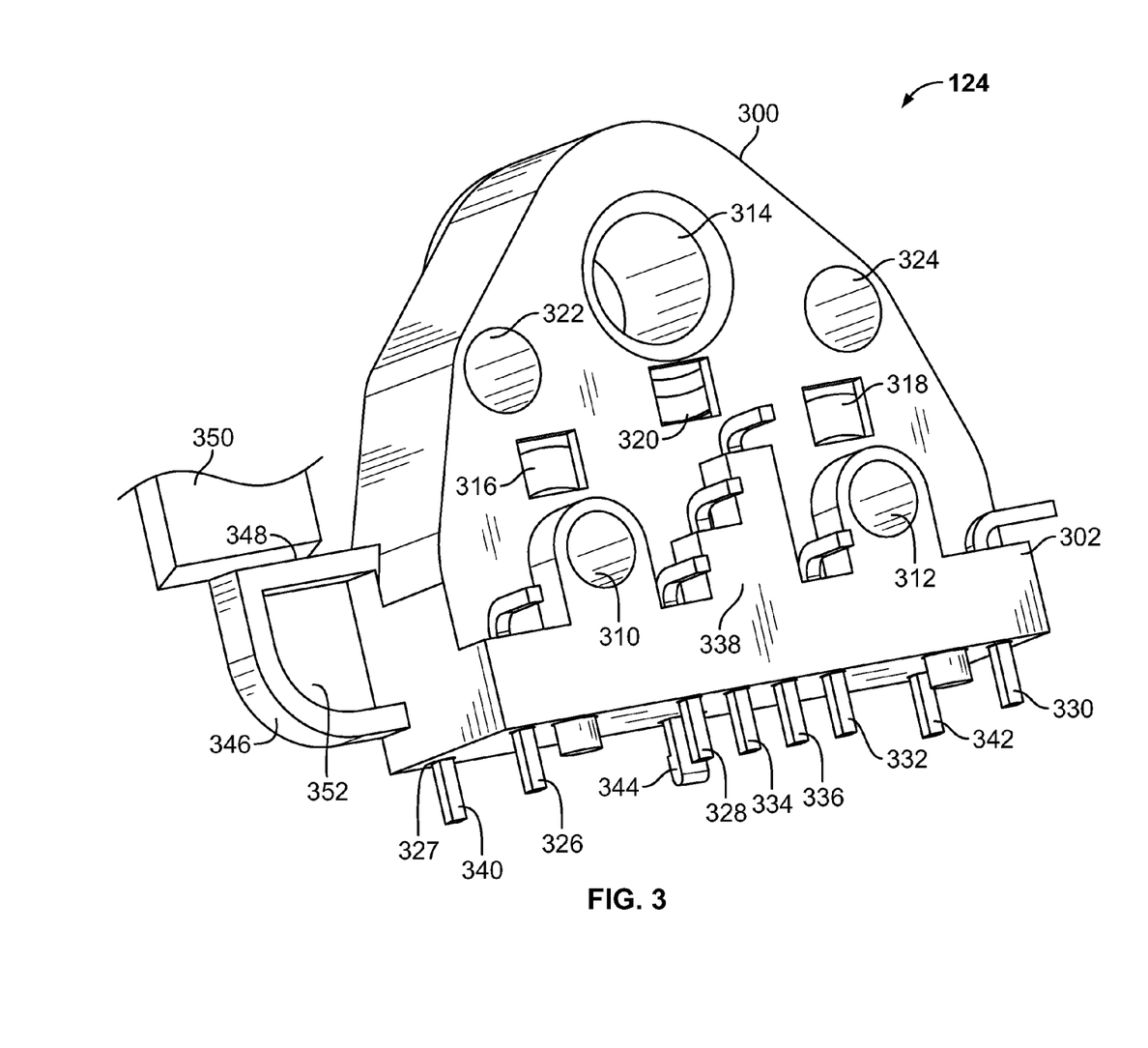
FIG. 3 is a perspective view of a current transformer assembly.

Referring to FIG. 3, there is shown a perspective view of the current transformer assembly 124. The current transformer assembly 124 includes an assembly housing 300 that contains three current transformers (shown in FIG. 4). The assembly housing 300 can be constructed of a rigid material, such as a rigid plastic. The assembly housing 300 includes three elongated rings 310, 312, 314 that correspond to bores at the centers of the cores of the three current transformers. The elongated rings can be tapered (e.g., as shown for elongated ring 314), to allow for easier insertion of a current line through the hole during assembly. The assembly housing 300 also includes coil access windows 316, 318, 320 corresponding to each of the three current transformers. The assembly housing 300 further includes wire routing holes 322, 324 positioned on each side of the assembly housing 300 for improved wire management.

The assembly housing 300 can have a compact, generally pyramidal structure. A bottom portion 302 of the pyramid has a footprint that contacts the first rigid circuit board. The footprint is small, and takes up less space on the rigid circuit board than three separately-housed current transformers. For example, the bottom portion 302 can have a footprint with a width of approximately 1.033 inches and a depth of approximately 0.415 inches. The assembly housing 300 can have a height of approximately one inch. The elongated rings 310, 312 are dimensioned just wide enough to allow an insulated current line to be inserted during assembly. For example, the elongated rings 310, 312 can be approximately 0.125 inches in diameter. The elongated ring 314 can be dimensioned just large enough to accommodate the routing of three insulated current lines (as explained below). For example, the elongated ring 314 can be approximately 0.219 inches in diameter. The wire routing holes 322, 324 are dimensioned similarly to the elongated rings 310, 312. The dimensions of a circuit breaker can include a length of approximately 4.75 inches, a height of approximately 2.8 inches, and a depth of approximately 1.5 to 2 inches, for example.

Inserted through the bottom portion 302 of the assembly housing 300 are several current transformer pin connectors 326, 328, 330, 332, 334, 336. The pins 326, 328, 330, 332, 334, 336 are made of an electrically conducting material. Each of these pins is generally L-shaped, with a long portion inserted through the bottom portion 302 of the assembly housing 300 to expose a bottom portion of each pin. The bottom portion of each pin 326, 328, 330, 332, 334, 336 can be fixed (e.g., welded) to the first rigid circuit board 128. A top portion of each pin is generally perpendicular to the long portion, and is exposed above the bottom portion 302 of the assembly housing. The pins 334 and 336 are in a stepped configuration relative to the pin 328, and include long portions that are progressively longer than the those of the other pins 326, 328, 330, 332. The pins 334 and 336 are each positioned through a stepped region 338 of the bottom portion 302 of the assembly housing 302. The stepped configuration of the pins 328, 334, and 336 improves access to these pins during assembly.

The pins 326, 328, 330, 332, 334, 336 each have a generally square-shaped cross section. The holes in the assembly housing 300 through which the pins 326, 328, 330, 332, 334, 336 are inserted are generally round in cross section, as shown for round hole 327. The square-shaped cross sections of the pins inserted through generally circular holes helps prevent the pins 326, 328, 330, 332, 334, 336 from slipping in the holes during assembly or after.

The current sensor assembly 124 can also include dummy pins 340, 342 inserted through the bottom portion 302 of the assembly housing 300, positioned on the opposite side of the footprint of the assembly housings 300 from the pins 326, 328, 330, 332, 334, 336. The dummy pins 340, 342 can be fixed (e.g., soldered) to the first rigid circuit board 128 for improved structural support for the current sensor assembly 124. The current sensor assembly 124 can also include locking member 344, which can be inserted through the first rigid circuit board 128 and locked into place. The current sensor assembly 300 can further include a hold-down member 346. Another plastic case, e.g., an inner cover 350 of the circuit breaker 100 can be positioned to apply pressure to a flat surface 348 of the hold-down member 346 to fix the rigid circuit board 128 in place without mounting screws and prevent it from floating inside the circuit breaker 100. The hold-down member 346 can also stabilize the current sensor assembly 124 and reduce the likelihood of the connections between the pins and the first rigid circuit board 128 being damaged. The hold-down member 346 can also include be formed as a loop, with a hole 352 configured to allow a screw driver bit to access to a calibration screw (not shown) to calibrate a thermal trip (not shown).

Figure 4:
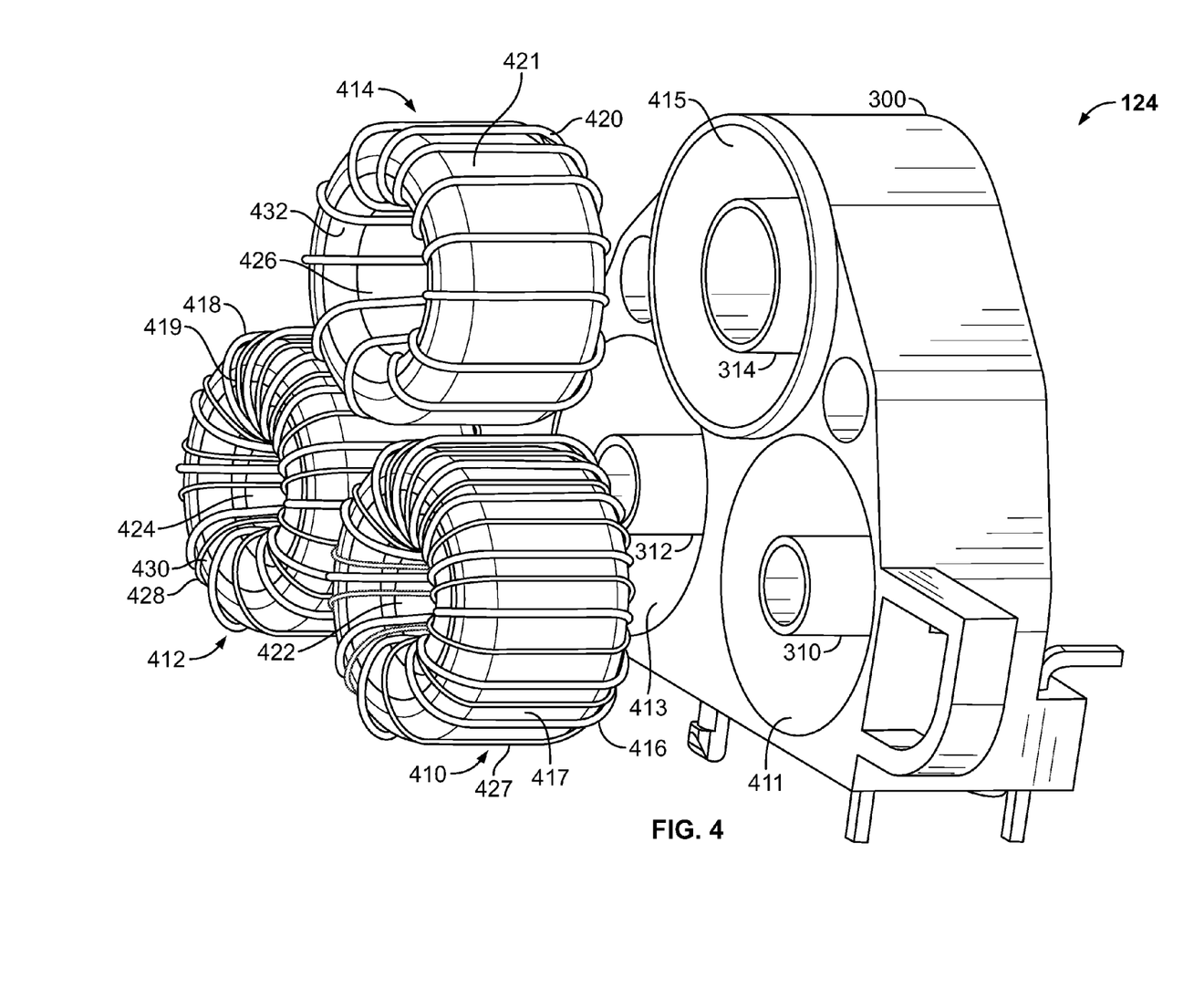
FIG. 4 is an exploded view of a current transformer assembly including three current transformers.

Referring to FIG. 4, there is shown an exploded view of the current sensor assembly 124, including the assembly housing 300 and three current transformers 410, 412, 414. Each of the current transformers 410, 412, 414 includes a sense coil of thin conducting wire 416, 418, 420, wrapped around a core 417, 419, 421. The sense coils 416, 418, 420, for example, can be constructed of a fine copper wire, and the cores 417, 419, 421, for example, can be constructed of a powdered metal. The current transformers 410 and 412 also include test coils 427, 428 respectively. The test coils can be used to test the sense coils. For example, current can be supplied to the test coils and sensed with the sense coils. The sensed currents can then be analyzed to determine whether the current transformers are working properly. The coils are illustrated with the wires exaggerated in size and spaced apart in order to illustrate the cores. However, a person of ordinary skill in the art would recognize that the coils are of densely wrapped wire, and the cores would not be exposed.

Each of the current transformers 410, 412, 414 has an open bore 422, 424, 426. The bores 422, 424, 426 are dimensioned slightly larger than the outer dimensions of the elongated rings 310, 312, 314. The current transformers 410, 412, and 414 can be inserted in the assembly housing 300 with the elongated rings 310, 312, 314 inserted though the bores 422, 424, 426 of the current transformers 410, 412, and 414, respectively. The current transformers 410, 412, 414 are positioned in wells 411, 413, 415, which help maintain the current transformers in fixed positions and electrically isolate the current transformers from each other and other electrical components. The current transformers 410, 412, 414 can include tapered portions 428, 430, 432, to allow for easier insertion of current lines through the bores 422, 424, 426 during assembly.

The current transformer 414 can be a ground fault current transformer. Where the current transformers 410, 412 are configured to accept a single current line through their respective elongated rings 310, 312, the ground fault current transformer 414 is configured to accept more than one current line through its elongated ring 314. Specifically, the ground fault current transformer is configured to accept the first current line 150, the second current line 154, and the neutral current line 152. Thus, in this embodiment, as explained above, the elongated ring 314 corresponding to the ground fault current transformer 414 has a larger radius than the elongated rings 310, 312 corresponding to the current transformers 410, 412. Likewise, the bore 426 of current transformer 414 has a larger radius than the bores 422, 424 of current transformers 410, 412.

Figure 5:
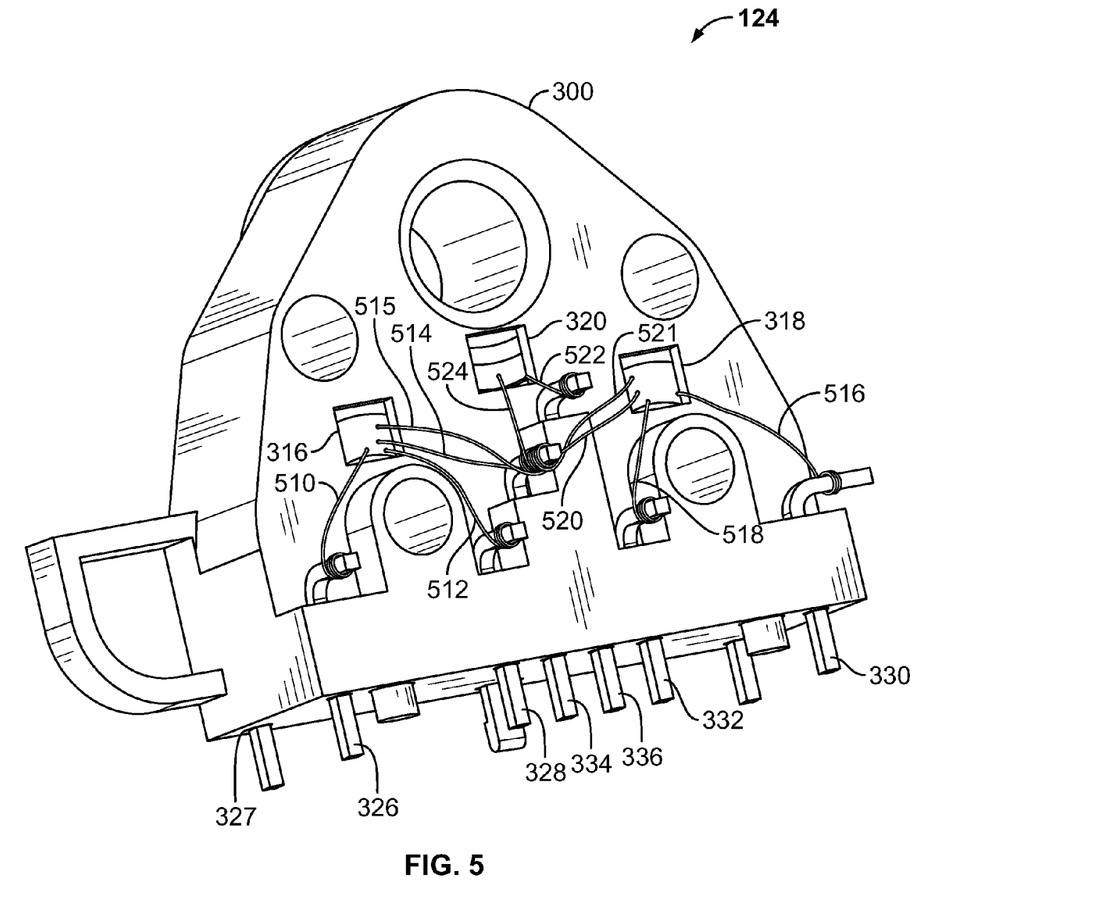
FIG. 5 is a perspective view of a current transformer assembly including the wiring for three current transformers.

Referring to FIG. 5, there is shown a perspective view of the current transformer assembly 124 including the wiring for the three current transformers 410, 412, 414. Each coil of wire 416, 418, 420, 426, 428 for the current transformers 410, 412, 414, includes a first end and a second end. The first end 510 of the coil 416 is coupled to the pin 326. In this embodiment, the first end 510 is wrapped around the top portion of the pin 326 and soldered in place. The ends of the wire of coil 416 are routed through the access window 316 of the assembly housing 300. The L shape of the pin 326 provides better access to the top portion of the pin 326 during assembly, making it easier to couple the wire to the pin 326. The access window 316 permits the coil 416 to be more easily accessed during assembly. The second end 514 of the coil 416 is routed through the access window 316 and is wrapped around the top portions of the pin 334 and preferably soldered into place. The pin 334 is a common pin (also referred to as a common conducting pin). The first end 512 of the test coil 426 is routed through the window 316 and wrapped around the top portion of the pin 328 and preferably soldered, and the second end 515 of the test coil 426 is routed through the window 316 and wrapped around the top portion of the common pin 334 and preferably soldered. Similarly, the first end 516 of the coil 418 is routed through the access window 318, wrapped around the pin 330, and preferably soldered into place. The second end 520 of the coil 418 is routed through the access window 318, wrapped around the common pin 334, and preferably soldered into place. The first end 518 of the test coil 428 is routed through the window 318 and wrapped around the top portion of the pin 332 and soldered, and the second end 521 of the test coil 426 is routed through the window 318 and wrapped around the top portion of the common pin 334 and preferably soldered. The pins 326, 328, 330, and 332 are also referred to herein as transformed conducting pins. The first end 522 of the coil 420 is routed through the access window 320, wrapped around the pin 336 (also referred to herein as the ground fault conducting pin) and preferably soldered into place. The second end 524 of the coil 420 is routed through the access window 320, wrapped around the common pin 334, and preferably soldered into place. The stepped configuration of the pins 328, 334, and 336 permits easier access to these pins during assembly, providing improved wire routing.

Figure 6:
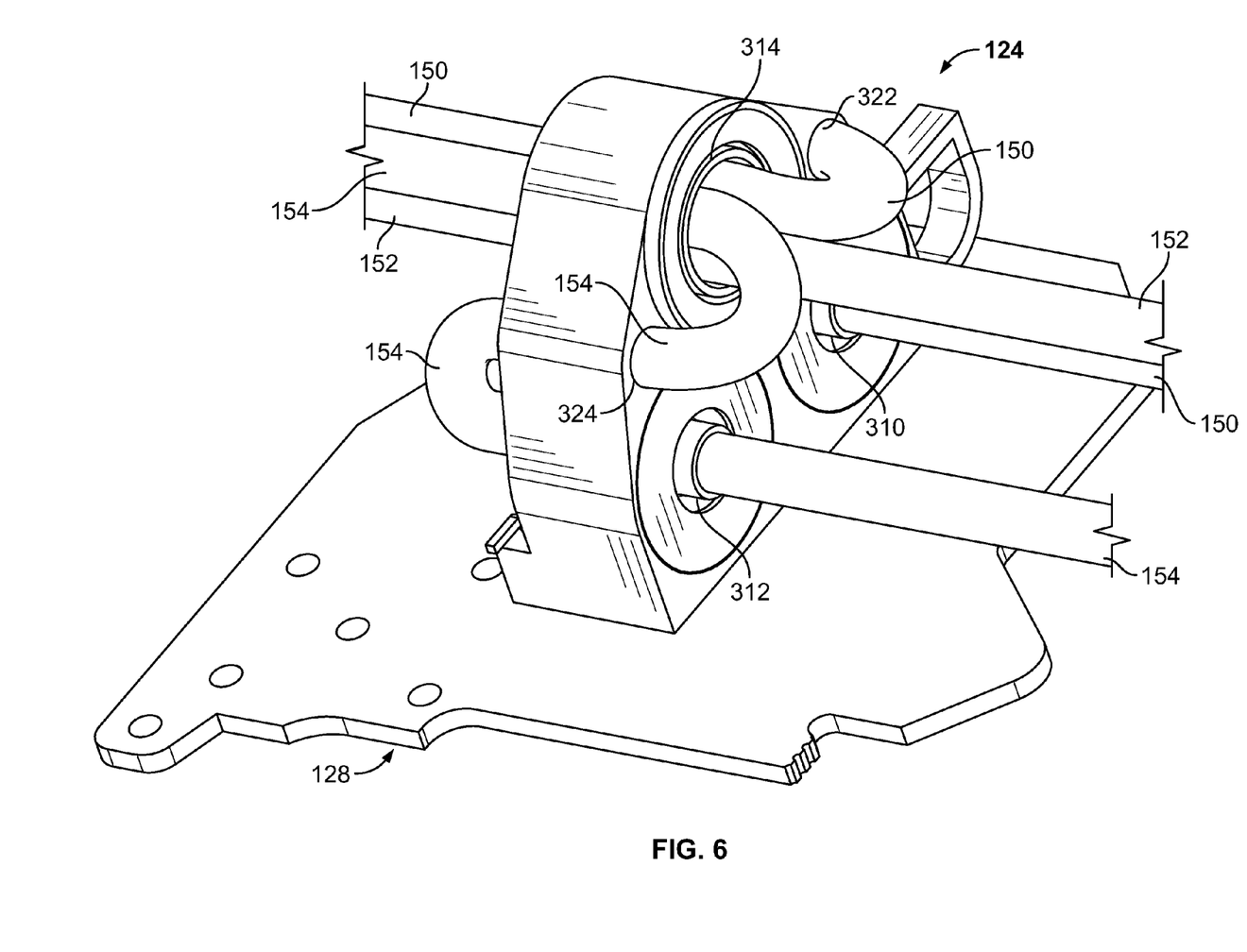
FIG. 6 is an exploded view of a current transformer including the routing of current lines.

Referring to FIG. 6, a perspective view of a rear portion of the current sensor assembly 124 is shown mounted to the first rigid circuit board 128 and with the current lines installed in the current transformers. The first current line 150 is installed through the elongated ring 310, around which the current transformer 410 is installed. The first current line 150 is routed through the elongated ring 310, back through the routing hole 322, and further routed through the elongated ring 314, around which the ground fault current transformer 414 is installed. The second current line 154 is routed through the elongated ring 312, around which the current transformer 412 is installed, back around through the routing hole 324, and further routed through the elongated ring 314. The neutral current line 152 is routed, along with the first and second current lines 150, 154, through the elongated ring 314 corresponding to the ground fault current transformer 414.

The first, second, and neutral current lines 150, 154, 152, are insulated wires The diameters of the elongated rings 310, 312 are just large enough to allow installation of the first and second current lines 150, 154 through the elongated rings 310, 312, and yet still maintain the first and second current lines 150, 154 substantially in the centers of the bores 422, 424. Maintaining the current lines as close as possible to the centers of the bores of the current transformers is helpful to obtain more accurate current measurements with less distortion. The routing holes 322, 324 permit the current lines 150, 154 to be routed though the ground fault current transformer 414 in the same direction as through the current transformers 410, 412, leading to improved current line routing.

The current passing through the first current line 150 can be measured using the current transformer 410. As current passes through the first current line 150, a corresponding current is induced in the coil 416. Thus, the current flowing through the first current line 150 can be sensed through the insulating material encasing the current line 150, without any direct connection to the conductor in the current line 150. The magnitude of the induced current in the coil 416 is dependent on the magnitude of the current passing through the first current line 150. The induced current in the coil 416 can be measured by measuring the voltage across the pins 326, 334. Similarly, the induced current in the coil 416 can be measured by measuring the voltage across the pins 330, 334. Measurements of the currents flowing through the first and second current lines 150, 154, can be used to determine faults in the wiring coupled to the current lines, and can be used to trip the circuit breaker accordingly. For example, if the current flowing through one of the current lines exceeds a threshold value for a certain period of time, the circuit breaker can be tripped.

The current induced in the coil 420 of the ground fault current transformer 414 can be measured by measuring the voltage across the pins 336 and 334. The current induced in the coil 420 corresponds to the aggregate of the currents flowing through the first, second, and neutral current lines 150, 154, 152. During normal operation, the aggregate of the currents flowing through the current lines is approximately zero. During a fault condition, a non-zero current can be detected, and the circuit breaker can be tripped accordingly.

As can be seen, space on a printed circuit board can be saved by combining multiple current transformers into a single current sensor assembly. The pyramid structure, with two current transformers 410, 412 positioned near the bottom of the pyramid and a third current transformer 414 stacked on top of and in between the first and second current transformers 410, 412 results in a compact configuration that allows for access to the bores of all three current transformers 410, 412, 414, and yet is sturdy enough to withstand assembly without breaking off of the rigid circuit board. The pyramid structure also permits the pins, which must contact the rigid circuit board 128 at the base of the pyramid, to be spaced out for easier access during assembly (including wrapping and soldering of wires to the pins). The wire routing holes 322, 324 contain the current lines, reducing the impact the current lines have on assembly and routing of nearby components, and allow for directing the current lines through the ground fault current transformer 414 in the same direction as they are routed through the current transformers 410, 412. The configuration of the pins can be chosen to optimize the printed circuit board layout and to provide easier access to the pins during assembly.

While particular embodiments, aspects, and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims. For example, the current sensor housing can be expanded to accommodate additional current transformers (e.g., 4, 8, 10, etc.) for sensing the current through additional current lines by applying the principles disclosed herein. For example, the housing could be configured to accept three current transformers in a bottom portion, and two current transformers stacked on top of the three, with the connector pins arranged in step configurations where appropriate.

What is claimed is:

1. A current-sensing assembly comprising:
   a housing;
   first and second current transformers contained in and fixed in position by the housing, each current transformer including a conducting wire wrapped around a core;
   at least one transformer conducting pin corresponding to each of the first and second current transformers, each pin inserted through the housing to expose a top end and a bottom end;
   a common conducting pin inserted through the housing to expose a top end and a bottom end;
   wherein, for each of the first and second current transformers, the top end of the transformer pin is electrically coupled to an end of the conducting wire of the corresponding current transformer through a window in the housing coinciding with the current transformer;
   the top end of the common pin is electrically coupled to the opposite end of the coil conductor through the window; and
   the bottom end of the transformer pin is configured to be coupled to a printed circuit board; and
   the housing comprising first and second elongated rings passing substantially through the center of the corresponding current transformer, the elongated rings configured to accept first and second current lines, respectively.

2. The current-sensing assembly of claim 1, wherein the first and second current transformers are positioned adjacent to one another and substantially in a bottom portion of the housing.

3. The current-sensing assembly of claim 1, wherein each of the first and second elongated rings is configured to hold the corresponding current line substantially in the center of the bore of the current transformer.

4. The current-sensing assembly of claim 1, wherein the transformer and common pins comprise square-shaped cross sections and the housing comprises round holes configured to accept the pins.

5. The current-sensing assembly of claim 1, wherein at least one of the transformer and common pins is L-shaped.

6. The current-sensing assembly of claim 5, wherein the end of the conducting wire coupled to the top end of the L-shaped pin is wrapped around the top end of the pin and soldered in place.

7. The current-sensing assembly of claim 1, further comprising:
   a ground fault current transformer contained in and fixed in position by the housing, the ground fault current transformer comprising a conducting wire wrapped around a core; and
   at least one ground fault conducting pin corresponding to the ground fault current transformer, the ground fault pin inserted through the housing to expose a top end and a bottom end, wherein for the ground fault current transformer,
   the top end of the ground fault pin is coupled to an end of the conducting wire of the ground fault current transformer through a window in the housing corresponding to the ground fault current transformer and the top end of the common pin is coupled to the opposite end of the conducting wire through the window; and the bottom end of the ground fault pin is configured to be coupled to the printed circuit board.

8. The current-sensing assembly of claim 7, the housing comprising a third elongated ring passing substantially through the center of the ground fault current transformer, the third elongated ring configured to accept the first and second current lines and a neutral current line.

9. The current-sensing assembly of claim 7, wherein the first, second, and ground fault current transformers are fixed in a pyramid-shaped configuration relative to the printed circuit board in which the ground fault current transformer is positioned above the first and second transformers.

10. The current-sensing assembly of claim 1, wherein the housing further comprises a hold-down member formed as a loop extending from the housing and comprising a flat surface configured to accept pressure from a surface of a cover of a circuit breaker.

11. The current-sensing assembly of claim 1, wherein the housing further comprises first and second wire routing holes configured to receive the first and second current lines.

12. The current-sensing assembly of claim 11, wherein the current-sensing assembly is configured to be installed in an electronic circuit breaker.

13. The current-sensing assembly of claim 1, wherein the housing further comprises first and second wells configured to maintain the first and second current transformers, respectively, in fixed positions.

14. A current-sensing assembly comprising:
a housing;
a first current transformer positioned substantially at a bottom portion of the housing and mounted around a first elongated ring of the housing, the first elongated ring comprising a tapered region configured to guide a first current line through the first elongated ring and substantially through the center of a bore of the first current transformer;
a second current transformer positioned substantially at the bottom portion of the housing and adjacent to the first current transformer, the second current transformer mounted around a second elongated ring of the housing, the second elongated ring comprising a tapered region configured to guide a second current line through the second guide and substantially through the center of a bore of the second current transformer; and
a third current transformer positioned in a top portion of the housing substantially above the first and second current transformers relative to the bottom portion of the housing and mounted around a third elongated ring of the housing, the third elongated ring comprising a tapered region configured to guide at least one current line through the third elongated ring;
wherein the first, second, and third current transformers are configured to produce induced currents corresponding to the currents carried by the current lines.

15. The current-sensing assembly of claim 14, wherein the third current transformer is a ground fault current transformer configured to accept the first current line, the second current line, and a neutral current line.

16. The current-sensing assembly of claim 14, further comprising a set of L-shaped pins with square cross sections mounted through round holes in the housing, wherein:
an end of a coil conductor of one of the first, second, and third current transformers is wound around a top end of a corresponding one of the set of L-shaped pins; and
an opposite end of the corresponding L-shaped pin protrudes through the bottom portion of the housing and is configured to be mounted to a printed circuit board.

17. The current-sensing assembly of claim 14, wherein the first, second, and third current transformers are fixed in a pyramid-shaped configuration relative to the printed circuit board in which the third current transformer is positioned above the first and second transformers.

18. The current-sensing assembly of claim 14, wherein the current-sensing assembly is configured to be installed in an electronic circuit breaker.

19. The current-sensing assembly of claim 14, wherein the housing further comprises first, second, and third wells configured to maintain the first, second, and third current transformers, respectively, in fixed positions.

\* \* \* \* \*